US012615804B1

(12) United States Patent
Cadien et al.

(10) Patent No.: US 12,615,804 B1
(45) Date of Patent: Apr. 28, 2026

(54) THIN-FILM TRANSISTORS WITH METAL OXIDE CHANNEL INTERFACES

(71) Applicant: Zinite Corporation, Edmonton (CA)

(72) Inventors: Ken Cadien, Edmonton (CA); Joel Fleck, Edmonton (CA); Kwanghyun Kim, Edmonton (CA)

(73) Assignee: Zinite Corporation, Edmonton (CA)

( * ) Notice: Subject to any disclaimer, the term of this patent is extended or adjusted under 35 U.S.C. 154(b) by 0 days.

(21) Appl. No.: 19/363,197

(22) Filed: Oct. 20, 2025

Related U.S. Application Data

(60) Provisional application No. 63/714,396, filed on Oct. 31, 2024.

(51) Int. Cl.
*H10D 30/67* (2025.01)
*H10D 30/01* (2025.01)
*H10D 62/60* (2025.01)

(52) U.S. Cl.
CPC ..... *H10D 30/6755* (2025.01); *H10D 30/0314* (2025.01); *H10D 30/6706* (2025.01); *H10D 30/6731* (2025.01); *H10D 30/6736* (2025.01); *H10D 30/6757* (2025.01); *H10D 62/60* (2025.01)

(58) Field of Classification Search
CPC .......... H10D 30/6755; H10D 30/0314; H10D 30/6706; H10D 30/6731; H10D 30/6736; H10D 30/6757; H10D 62/60
See application file for complete search history.

(56) References Cited

U.S. PATENT DOCUMENTS

| | | |
|---|---|---|
| 6,501,094 B1 | 12/2002 | Yamazaki et al. |
| 8,841,662 B2 | 9/2014 | Yamazaki et al. |
| 9,601,631 B2 | 3/2017 | Godo |
| 9,761,732 B2 | 9/2017 | Nomura et al. |
| 10,002,949 B2 | 6/2018 | Yamazaki et al. |
| 10,224,429 B2 | 3/2019 | Bu et al. |
| 10,381,451 B2 | 8/2019 | Masuoka et al. |
| 10,790,356 B2 | 9/2020 | Lee et al. |
| 11,227,953 B2 | 1/2022 | Kato et al. |

(Continued)

FOREIGN PATENT DOCUMENTS

| | | |
|---|---|---|
| CN | 108091624 A | 5/2018 |
| CN | 108109996 A | 6/2018 |

(Continued)

OTHER PUBLICATIONS

Adl et al., Schottky Barrier Thin Film Transistors Using Solution-Processed n-ZnO, ACS Applied Materials & Interfaces 2012, vol. 4, pp. 1423-1428, Edmonton, AB, Canada, Mar. 4, 2012.

(Continued)

*Primary Examiner* — Allison Bernstein
(74) *Attorney, Agent, or Firm* — MLO, a professional corp.

(57) ABSTRACT

An example thin-film transistor includes a source, a drain, a gate, and a body of channel material disposed within the influence of the gate between the source and the drain. The body of channel material includes a metal oxide. The body of channel material forms a carrier channel between the source and the drain when sufficient voltage is applied to the gate. The source includes a body of source material that includes ruthenium and an oxide-stabilizing metal that has an oxide that has greater hydrogen stability than ruthenium oxide.

23 Claims, 8 Drawing Sheets

(56) References Cited

U.S. PATENT DOCUMENTS

| | | | | |
|---|---|---|---|---|
| 11,949,019 | B2* | 4/2024 | Barlage | H01L 25/16 |
| 2008/0121869 | A1 | 5/2008 | Wu et al. | |
| 2008/0203387 | A1* | 8/2008 | Kang | H10D 30/6755 |
| | | | | 257/E29.096 |
| 2009/0224238 | A1 | 9/2009 | Kim et al. | |
| 2010/0237386 | A1 | 9/2010 | Lin et al. | |
| 2010/0301340 | A1 | 12/2010 | Shih et al. | |
| 2013/0187164 | A1 | 7/2013 | Oshima et al. | |
| 2013/0320339 | A1 | 12/2013 | Kawashima et al. | |
| 2015/0137368 | A1 | 5/2015 | Pelto et al. | |
| 2016/0315196 | A1 | 10/2016 | Barlage et al. | |
| 2017/0365714 | A1 | 12/2017 | Bu et al. | |
| 2018/0190824 | A1 | 7/2018 | Bae et al. | |
| 2019/0043946 | A1 | 2/2019 | Lee et al. | |
| 2020/0006575 | A1 | 1/2020 | Dewey et al. | |
| 2020/0096558 | A1 | 3/2020 | Ide | |
| 2020/0098930 | A1 | 3/2020 | Le et al. | |
| 2020/0098931 | A1 | 3/2020 | Sharma et al. | |
| 2020/0135771 | A1 | 4/2020 | Park et al. | |
| 2020/0203432 | A1 | 6/2020 | Rachmady et al. | |
| 2021/0156908 | A1 | 5/2021 | Yang et al. | |
| 2021/0202760 | A1 | 7/2021 | Jang et al. | |
| 2024/0055529 | A1 | 2/2024 | Barlage et al. | |
| 2024/0213370 | A1* | 6/2024 | Barlage | H10D 30/6728 |
| 2024/0355895 | A1 | 10/2024 | Cadien et al. | |

FOREIGN PATENT DOCUMENTS

| | | | |
|---|---|---|---|
| EP | 2339638 | A1 | 6/2011 |
| GB | 2571351 | A | 8/2019 |
| JP | 2012160737 | A | 8/2012 |
| JP | 2013138195 | A | 7/2013 |
| JP | 2013149827 | A | 8/2013 |
| JP | 2018511936 | A | 4/2018 |
| KR | 20140125325 | A | 10/2014 |
| KR | 20200035170 | A | 4/2020 |
| WO | 2011055620 | A1 | 5/2011 |
| WO | 2017052650 | A1 | 3/2017 |
| WO | 2017061050 | A1 | 4/2017 |
| WO | 2019107411 | A1 | 6/2019 |
| WO | 2020109816 | A2 | 6/2020 |
| WO | 2020167658 | A1 | 8/2020 |
| WO | 2023177157 | A1 | 9/2023 |

OTHER PUBLICATIONS

Klassens et al., A tin oxide field-effect transistor, Solid-State Electronics Pergamon Press 1964, vol. 7, pp. 701-702. Printed in Great Britain, May 4, 1964.

Li et al., Performances of Cr2O3-hydrogen isotopes permeation barriers, Elsevier, International Journal of Hydrogen Energy 40, pp. 6459-6464. Apr. 8, 2015.

Shoute et al., Sustained hole inversion layer in a wide-bandgap metal-oxide semiconductor with enhanced tunnel current, Nature Communications, DOI: 10.1038/ncomms10632, pp. 1-6, Feb. 4, 2016.

Watson et al., Building a Thermodynamic Database for Platinum-Based Superalloys: Part II, Platinum Metals Rev., 51, (4), pp. 189-198, Oct. 2007.

Won et al., Effect of Oxygen Source on the Various Properties of SnO2 Thin Films Deposited by Plasma-Enhanced Atomic Layer Deposition, MDPI, Coatings, 10, 692, pp. 1-10, Jul. 18, 2020.

International Search Report and Written Opinion dated Feb. 3, 2026 for PCT Patent Application No. PCT/IB2025/060686.

* cited by examiner

80

START

FORM SOURCE/DRAIN
MATERIAL WITH OXIDE-
STABILIZING METAL
82

FORM CHANNEL
MATERIAL
84

FORM GATE MATERIAL
86

END

90

START

TREAT SOURCE/DRAIN
METAL AND OXIDE-
STABILIZING METAL TO
FORM OXIDE
92

END

96

START

FORM OXIDIZED ALLOY
OF SOURCE/DRAIN METAL
AND OXIDE-STABILIZING
METAL
98

END

Ru:Cr (90:10) C-V

Ru:Co (90:10) C-V

1

THIN-FILM TRANSISTORS WITH METAL OXIDE CHANNEL INTERFACES

CROSS-REFERENCE TO RELATED APPLICATIONS

This application claims the benefit of and priority to U.S. provisional patent app. Ser. No. 63/714,396, filed Oct. 31, 2024, which is incorporated herein by reference.

FIELD

The present disclosure relates to thin-film transistors and related methods.

BACKGROUND

Thin-film transistors (TFTs) are widely used in display devices and are increasingly used in other applications. A conventional TFT is composed of thin films of materials formed in sequence to create a stack-like arrangement. Such thin films are normally of nanometer-scale thickness.

The manufacture and operation of TFTs are heavily dependent on the materials and processes used. In order to expand the useful applications TFTs, it is helpful to investigate new materials and develop new processes.

SUMMARY

According to an aspect of the present disclosure, a thin-film transistor includes a source, a drain, a gate, and a body of channel material disposed within the influence of the gate between the source and the drain. The body of channel material includes a metal oxide. The body of channel material forms a carrier channel between the source and the drain when sufficient voltage is applied to the gate. The source includes a body of source material that includes ruthenium and an oxide-stabilizing metal that has an oxide that has greater hydrogen stability than ruthenium oxide.

The oxide-stabilizing metal may be selected from the group consisting of chromium, cobalt, and molybdenum. For example, the oxide-stabilizing metal may be chromium.

The thin-film transistor may further include a source-channel interface at the body of source material adjacent the body of channel material. The source-channel interface may include ruthenium oxide and the oxide of the oxide-stabilizing metal.

The body of source material may consist essentially of ruthenium and the oxide-stabilizing metal.

The body of source material may contain a majority of ruthenium with a minority of the oxide-stabilizing metal.

The body of source material may be ruthenium with about 15 atomic % oxide-stabilizing metal or less.

The body of source material may be ruthenium with about 10 atomic % oxide-stabilizing metal or less.

The body of source material may be ruthenium with about 5 atomic % oxide-stabilizing metal or less.

The drain may include a body of drain material that includes ruthenium and the oxide-stabilizing metal.

The thin-film transistor may further include a drain-channel interface at the body of drain material adjacent the body of channel material. The drain-channel interface may include ruthenium oxide and the oxide of the oxide-stabilizing metal.

According to an aspect of the present disclosure, a method of manufacturing a thin-film transistor includes forming a body of source material, forming a body of drain material,

2 forming a body of channel material, and forming a body of gate material. The body of channel material is formed within the influence of the body of gate material between the bodies of source and drain material. The body of channel material includes a metal oxide. The body of source material includes ruthenium and an oxide-stabilizing metal that has an oxide that has greater hydrogen stability than ruthenium oxide.

The oxide-stabilizing metal may be selected from the group consisting of chromium, cobalt, and molybdenum. For example, the oxide-stabilizing metal may be chromium.

The method may further include forming a source-channel interface at the body of source material. The source-channel interface may include ruthenium oxide and the oxide of the oxide-stabilizing metal.

Forming the source-channel interface may include applying oxygen plasma to the body of source material.

The body of source material may be formed to consist essentially of ruthenium and the oxide-stabilizing metal.

The body of source material may be formed to contain a majority of ruthenium with a minority of the oxide-stabilizing metal.

The body of source material may be formed of ruthenium with about 15 atomic % oxide-stabilizing metal or less.

The body of source material may be formed of ruthenium with about 10 atomic % oxide-stabilizing metal or less.

The body of source material may be formed of ruthenium with about 5 atomic % oxide-stabilizing metal or less.

The body of drain material may include ruthenium and the oxide-stabilizing metal.

The method may further include forming a drain-channel interface at the body of drain material. The drain-channel interface may include ruthenium oxide and the oxide of the oxide-stabilizing metal.

Forming the drain-channel interface may include applying oxygen plasma to the body of drain material.

The body of source material may be formed by sputtering.

DETAILED DESCRIPTION

Figure 1:
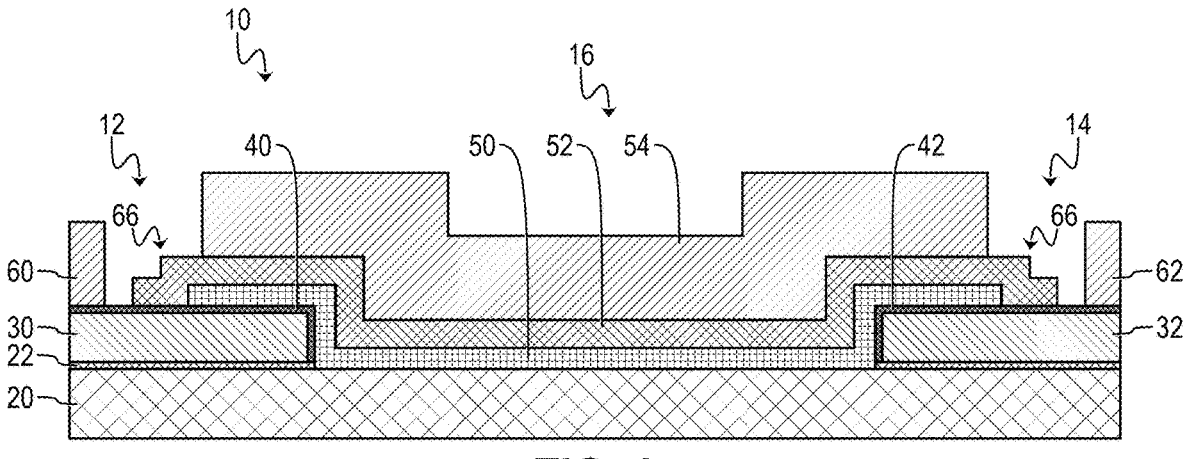
FIG. 1 is a cross-sectional view of an example thin-film transistor that includes a source/drain channel interface having a combination of metal oxides.

A typical thin-film transistor (TFT) includes a source, drain, gate, and semiconductor channel material. When a voltage is applied between the source and drain and a suitable voltage is applied to the gate, a carrier channel forms in the semiconductor material causing current to flow between source and drain.

Various improvements may be made to TFTs to allow for greater efficiency. In U.S. Pat. No. 11,949,019, which is incorporated herein by reference, Barlage et al. teach a channel interfacial member at the source/drain that, among other things, can reduce off current, which in turn reduces power consumption and may provide other benefits. However, such channel interfaces, particularly when they are quite thin (e.g., on the order of 1 nm), may be subject to instability that prevents their full potential from being realized in certain circumstances. For example, hydrogen that is often used during manufacture of TFTs and other semiconductor devices (e.g., as a constituent of forming gas) may act to reduce a channel interface to an undesirable degree during manufacture, thereby degrading its intended function.

Ruthenium is a suitable metal for use as a source, and optionally a drain, of a TFT for at least the reason that it has improve ruthenium oxide stability by introducing an oxide-stabilizing metal to the source, and optionally, the drain.

In various examples of the present disclosure, the source, and optionally the drain, of a TFT is formed of a combination of metals (e.g., an alloy) that is majority ruthenium with a minority of an oxide-stabilizing metal. The oxide-stabilizing metal should be selected based on the criteria that it is suitable for use in back end of line (BEOL) and/or middle of line (MOL) manufacturing processes, is soluble in ruthenium, has a p-type oxide, and is stable in the presence of hydrogen. The minority metal's oxide should have greater hydrogen stability than ruthenium oxide, so that the oxidation of the alloy results in a combined oxide that is more stable than ruthenium oxide alone. Preferably, the minority metal's oxide should have greater hydrogen stability under suitable anneal conditions, such as temperatures lower than about 500° C., lower than about 450° C., or equal to about 400° C., for a suitable duration, such as about 15 minutes, 30 minutes, 60 minutes, 120 minutes, 3 hours, or longer. Preferred anneal conditions, which are not to be taken as limiting, are about 400° C. for about 120 minutes.

Table 1 shows a summary of unpaired electrons in several metals. Some of these metals can also form p-type oxides (or behave as p-type oxides under certain conditions), such as $RuO_2$, $MoO_2$, $Co_3O_4$, $NiO$, $Cr_2O_3$, and $CuO_2$. Accordingly, preferred examples of suitable oxide-stabilizing metals include chromium, cobalt, and molybdenum. Titanium and tin are also possible suitable oxide-stabilizing metals, as tin monoxide (SnO) is p-type and titanium dioxide ($TiO_2$) can be p-type. Chromium is the presently preferred and, in the description below, chromium is discussed as the primary example. However, this should not be taken as unduly limiting and other suitable metals, such as cobalt, may be used depending on their relevant characteristics.

TABLE 1

| | | | | | | | | |
|---|---|---|---|---|---|---|---|---|
| Summary of Non-Paired Electrons in Various Metals | | | | | | | | |
| Metal | Electronic structure | # of unpaired electrons per atom | Density (g/cm³) | GAW (g) | GAW per cm³ | Avogadro's number | Atom density (#/cm³) | Unpaired electron density (#/cm³) |
| Cr | $4s^13d^5$ | 6 | 7.15 | 51.996 | 0.13751 | 6.0221E+23 | 8.28E+22 | 4.97E+23 |
| Mn | $4s^23d^5$ | 5 | 7.2 | 54.938 | 0.13106 | | 7.89E+22 | 3.95E+23 |
| Mo | $5s^14d^5$ | 6 | 10.2 | 95.94 | 0.10632 | | 6.40E+22 | 3.84E+23 |
| Ru | $5s^14d^7$ | 4 | 12.3 | 101.07 | 0.1217 | | 7.33E+22 | 2.93E+23 |
| Co | $4s^23d^7$ | 3 | 8.9 | 58.933 | 0.15102 | | 9.09E+22 | 2.73E+23 |
| W | $6s^24f^{14}5d^4$ | 4 | 19.3 | 183.85 | 0.10498 | | 6.32E+22 | 2.53E+23 |
| V | $4s^23d^3$ | 3 | 5.96 | 50.942 | 0.117 | | 7.05E+22 | 2.11E+23 |
| Ni | $4s^23d^8$ | 2 | 8.9 | 58.693 | 0.15164 | | 9.13E+22 | 1.83E+23 |
| Ti | $3d^24s^2$ | 2 | 4.506 | 47.867 | 0.09414 | | 5.67E+22 | 1.13E+23 |
| Hf | $6s^24f^{14}5d^2$ | 2 | 13.3 | 178.49 | 0.07451 | | 4.49E+22 | 8.97E+22 |
| Zr | $5s^24d^2$ | 2 | 6.49 | 91.224 | 0.07114 | | 4.28E+22 | 8.57E+22 |
| Cu | $3d^{10}4s^1$ | 1 | 8.96 | 63.546 | 0.141 | | 8.49E+22 | 8.49E+22 | a high concentration of unpaired (free) electrons. In addition to its useful electrical characteristics, ruthenium oxide can behave in a p-type manner, particularly when positioned between ruthenium metal and n-type semiconductor channel material, such as tin oxide, and has been found to be useful in achieving low off current when used as a channel interface between source/drain and channel material. A source-channel interface, and optionally a drain-channel interface, may be formed of ruthenium oxide to reduce off current and gain other benefits, as will be discussed in detail below. However, under certain circumstances, particularly during manufacture, ruthenium oxide may be unstable in the presence of hydrogen. Accordingly, the present disclosure aims to FIG. 1 shows an example TFT 10 according to the present disclosure. The TFT 10 includes a source 12, drain 14, and gate 16. In various examples, the TFT 10 may be manufactured using BEOL and/or MOL processes.

The TFT 10 is formed with a planar substrate 20. The substrate 20 may be disposed over another layer of TFTs, whether manufactured in accordance with the present disclosure or by another technique. For example, the substrate 20 may be disposed over a layer of complementary metal-oxide semiconductor (CMOS) devices or other front end of line (FEOL) devices.

Examples of materials for the substrate 20 include silicon dioxide; silicon nitride; glass; fluorosilicate glass (FSG); a silicon wafer whose surface is processed with wet thermal oxide (WTO) or similar treatment; carbon doped oxide (CDO); organic polymers such as perfluorocyclobutane or polytetrafluoroethylene; organosilicates such as silsesquioxane, siloxane, organosilicate glass; flexible polymer; plastic; etc. Suitable combinations of such materials may also be used.

An adhesion layer 22 may be formed over the substrate 20 to promote adhesion of material to the substrate 20. The adhesion layer 22 may be formed of titanium nitride, hafnium nitride, or similar material.

The source 12 is formed of a body of source material 30 disposed on the substrate 20. The source material is a combination of ruthenium and a suitable oxide-stabilizing metal, such as chromium, as will be discussed in further detail below. In this example, the body of source material 30 is formed by sputtering to a thickness of about 25 nm. In other examples, other source thicknesses may be used, such as about 30 nm, 20 nm, 15 nm, 10 nm, etc.

In this example, the drain 14 is formed of a body of drain material 32 and has the same or similar material and/or structure as the source 12. A material and/or structure may be referred to as "source/drain" or similar terminology if useful as a source and/or a drain. In other examples, the drain 14 has a material and/or structure different to the source 12.

Examples of other drain materials that may be useful when the drain does not incorporate the present disclosure include various metals and other conductors, such as nickel, tungsten, copper, titanium nitride, etc. Further examples of other drain materials include heavily doped n-type materials, degenerate n-type silicon, and III-V compound semiconductors with high conductivity with predominately n-type or electron transport, etc.

The adhesion layer 22 promotes the adhesion of the bodies of source and drain material 30, 32 to the substrate 20. In other examples, the adhesion layer 22 may be omitted if the source/drain material has suitable adhesion without it.

To form the source-channel interface 40, the body of source material 30 may be subject to inline treatment, such as plasma treatment, anneal treatment, chemical or electrochemical treatment, or similar. Alternatively, the source-channel interface 40 may be deposited on the body of source material 30.

An example treatment forms source-channel interface 40 at the body of source material 30 at least between the body of source material 30 and the body of channel material 50. The interface 40 is a p-type semiconductor, or at least behaves in a p-type manner, because the material forming the interface is or behaves as a p-type material. The source-channel interface 40 may tune the threshold voltage at which TFT 10 turns on to reduce leakage current through TFT 10 in the off state. The source-channel interface 40 may create a repository of complimentary excess negative charge that functions to deplete the channel in at least the region of the body of channel material 50 adjacent the body of source material 30. The source-channel interface 40 may serve as a voltage-controlled electron transport barrier, resulting in substantially less current flow through body of channel material 50 when TFT 10 is in an off state. Further, the source-channel interface 40 may also serve to reduce stress induced leakage currents ("SILC") in TFT 10 by inhibiting the formation of interlayer stress-induced flaws between the body of channel material 50 and the body of source material 30. A drain-channel interface 42 may be similarly formed and may have similar characteristics, but it is contemplated that the source-channel interface 40 provides significant benefit without the drain-channel interface 42. The source-channel interface 40 may provide most or all of the benefit.

In this example, the ruthenium-chromium bodies of source and drain material 30, 32 are treated with oxygen plasma to form a layer of oxidized material that are the source and drain channel interfaces 40, 42. Since ruthenium oxide, which is contemplated to be primarily ruthenium (IV) oxide ($RuO_2$), behaves in a p-type manner and chromium oxide, which is contemplated to be primarily chromium (III) oxide ($Cr_2O_3$), is a p-type material, the source and drain channel interfaces 40, 42 are expected to be p-type.

The TFT 10 further includes a body of channel material 50 disposed between the source 12 and drain 14. In this example, the body of channel material 50 is disposed partially over the bodies of source and drain material 30, 32 and over the substrate 20 between the bodies of source and drain material 30, 32. The body of channel material 50 is an n-type metal oxide. In this example, the body of channel material 50 is a layer of tin oxide, which is primarily or entirely tin (IV) oxide ($SnO_2$, which may be referred to as "tin dioxide" or simply "tin oxide"), with a thickness of about 5 nm to about 10 nm. In this example, the layer of tin oxide is about 7 nm thick.

The tin oxide forming the body of channel material 50 is generally polycrystalline or, more specifically, nanocrystalline. The tin oxide may have a preferred crystallite orientation of Miller index <110> with respect to powder, for example, as determined using grazing-incidence x-ray diffraction (GI-XRD) with $\omega=0.5°$ on 20 nm and/or 40 nm thick samples. Nanocrystalline tin oxide with this preferred crystal orientation can provide good carrier mobility and good stability, which can improve the performance and useful life of the TFT 10.

For sake of clarity, tin oxide with an orientation of <110> means that one of the directions in the family of directions <110>, such as direction [110], is substantially normal to the plane of the substrate 20. In other words, a plane of the family {110}, such as the plane (110), is substantially parallel to the plane of the substrate 20. Additionally, a preferred crystallite orientation is with respect to powder, meaning that a crystallite orientation is preferred if present in a proportion higher than found in powder standard.

In some cases, the crystallinity of the thin film of tin oxide is at least about 70%. Regions outside the 2θ angular range of 20-60° may be ignored when computing crystallinity.

In various examples, the thin film of tin oxide has a mobility of greater than or equal to 100 $cm^2$/V·s and a carrier concentration of less than or equal to $1.0×10^{19}$ $cm^{-3}$, where these values are measured on the film itself as opposed to the completed TFT 10.

The TFT 10 further includes a body of gate dielectric material 52 disposed over the body of channel material 50. Examples of gate dielectric materials include high-K dielectric materials, hafnium oxide, silicon dioxide, silicon nitride, zirconium oxide, and aluminum oxide. In this example, the body of gate dielectric material 52 is a layer of hafnium oxide about 10-15 nm thick, such as about 12.5 nm thick.

The TFT 10 further includes a body of gate material 54 (also termed "gate metal") disposed over the gate dielectric material 52. The gate material is a conductor. Examples of gate materials include tungsten, titanium, titanium nitride, molybdenum, gold, platinum, aluminum, nickel, copper, chromium, hafnium, indium, manganese, iron, vanadium, zinc, tantalum, or alloys/combinations thereof. In this example, the body of gate material 54 includes a layer of titanium about 1 nm thick, over which is formed a layer of titanium nitride about 5 nm thick, and over which is formed a layer of tungsten about 30 nm thick.

The TFT 10 further includes a source electrode 60 as part of the source 12 and a drain electrode 62 as part of the drain 14. The source electrode 60 is in electrical contact with the body of source material 30 to conduct current to/from the body of source material 30. Likewise, the drain electrode 62 is in electrical contact with the body of drain material 32 to conduct current to/from the body of drain material 32. Examples of materials for electrodes 60, 62 include the gate materials listed above.

In operation, when a voltage is applied across the source electrode 60 and a drain electrode 62, and when a suitable voltage is applied to the body of gate material 54, a carrier channel forms in the body of channel material 50, which causes flow of current between source 12 and drain 14. When the voltage is removed, the flow of current is reduced to a very low amount, assisted by the source-channel interface 40 and, optionally, the drain-channel interface 42.

If the body of source material 30 were to be made of only ruthenium, the source-channel interface 40 would be primarily or exclusively ruthenium oxide and may be subject to degradation during manufacture and/or operation of the TFT 10. This is because ruthenium oxide may exhibit insufficient stability in the presence of hydrogen. Forming gas, which is a mixture of nitrogen and hydrogen, may be used in the manufacture of the TFT 10. As for operation, hydrogen, which may be intentionally or unintentionally present in various materials of the TFT 10 and/or surrounding devices, may migrate to the source-channel interface 40. The presence of hydrogen due to any of these or other circumstances may undesirably degrade the source-channel interface 40. To address this problem, the body of source material 30, as mentioned above, is made from a combination of ruthenium and a suitable oxide-stabilizing metal (e.g., chromium), such that the source-channel interface 40 includes both ruthenium oxide and another oxide (e.g., chromium oxide) that provides greater hydrogen stability.

For sake of clarity, it should be understood that ruthenium oxide may be thermodynamically unstable in the presence of hydrogen at expected operational temperatures of the TFT 10, while also being stable in terms of kinetics. That is, while ruthenium oxide will degrade as dictated by its free energy, the time required for the ruthenium oxide to degrade to a point that detrimentally affects the operation of the TFT 10 may greatly exceed the useful life of the TFT 10. However, annealing under forming gas (or other hydrogen-containing gas) is a widely used process in TFT manufacture irrespective of the use of ruthenium oxide. Accordingly, ruthenium oxide that might survive operational conditions may be undesirably degraded or destroyed during manufacture.

It should be noted again that the dominant species of ruthenium oxide is expected to be ruthenium (IV) oxide ($RuO_2$) and the dominant species of chromium oxide is expected to be chromium (III) oxide ($Cr_2O_3$). However, this is not limiting, and various advantages of the present disclosure may be realized with the presence of other species of one or both of these oxides.

Figure 2:
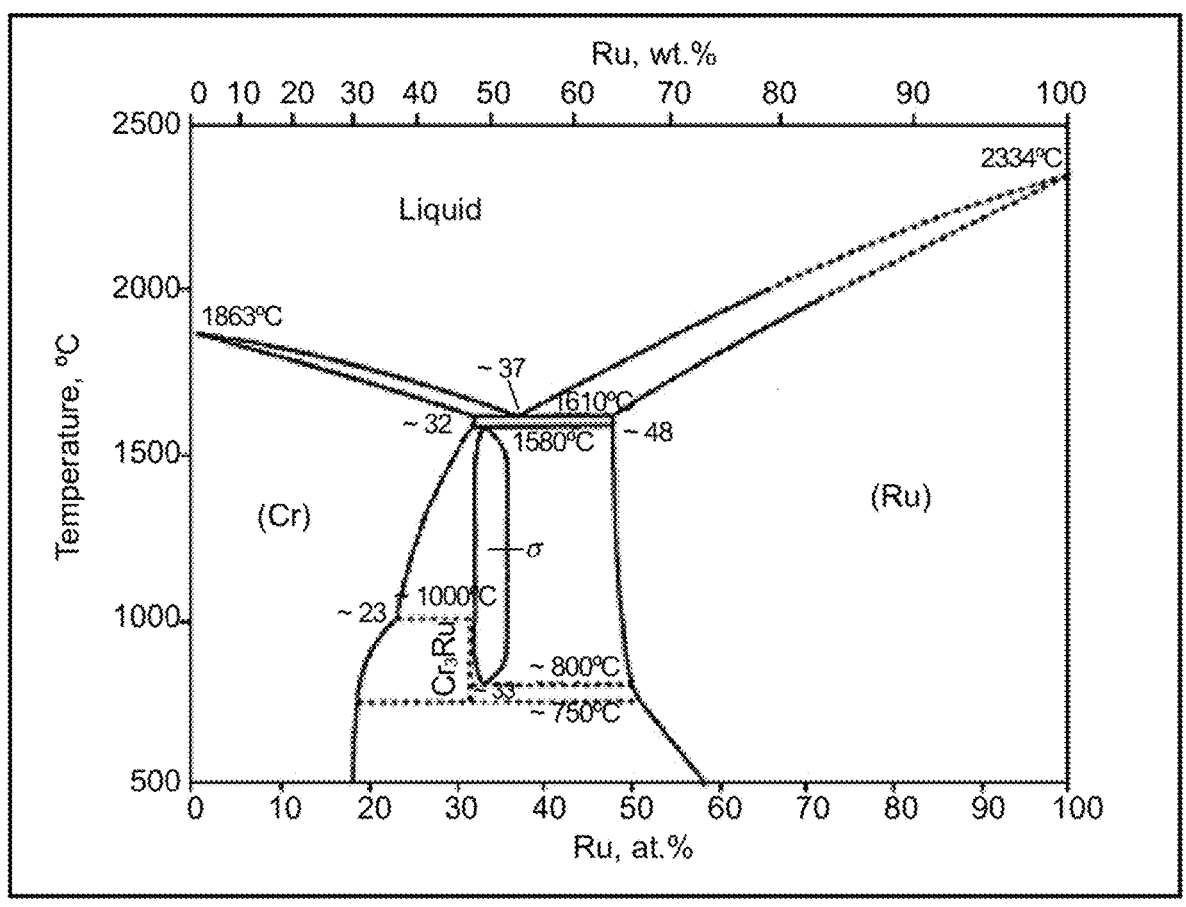
FIG. 2 is an example chromium-ruthenium phase diagram.

In view of the above, chromium is combined (alloyed) with ruthenium to form the body of source material 30. Chromium is very soluble in ruthenium, as indicated in the phase diagram of FIG. 2 (from "Building a Thermodynamic Database for Platinum-Based Superalloys: Part II", Watson et al., Platinum Metals Review, Vol. 51, Issue 4, October 2007, pgs. 189-198). At temperatures below 1500° C. ruthenium can dissolve more than 35 atomic % chromium.

In various examples, ruthenium is the majority material and chromium is the minority material, such that chromium is provided at less than about 50 atomic % of the total alloy. More specifically chromium may be provided, for example, in a proportion of about 15 atomic % or less, about 10 atomic % or less, or about 5 atomic % or less of the composition. Ruthenium is thus respectively present in a proportion of about 85 atomic % or more, about 90 atomic % or more, or about 95 atomic % or more. This alloy of ruthenium and chromium may exclude other materials, aside from a tolerable amount of contamination. Accordingly, when the source-channel interface 40 is formed, by for example oxidizing the body of source material 30, it is contemplated that the source-channel interface 40 will include ruthenium oxide and chromium oxide at about the same proportions as the base metals.

When a different oxide-stabilizing metal is selected, its concentration should be selected so that unwanted side effects are avoided. Titanium oxide or tin oxide, for example, should be provided at a proportion less than about 20 atomic % to promote conditions for the channel interface to be p-type.

By using a relatively low proportion of chromium, the beneficial properties of ruthenium for the body of source material 30 are retained or at least not unduly detrimentally affected. In addition, as mentioned above, chromium (III) oxide ($Cr_2O_3$) is a p-type oxide. Thus, the low-leakage current, etc. properties of the source-channel interface 40, discussed above, are not unduly detrimentally affected by the presence of chromium oxide. Moreover, as discussed above, compared to ruthenium oxide, chromium oxide is less reactive with hydrogen. Thus, chromium oxide present in the source-channel interface 40 may act as a hydrogen permeation barrier. As such, the combination of ruthenium and chromium serves well as the body of source material 30 and, when oxidized during manufacture, causes chromium oxide to form at the source-channel interface 40 among the ruthenium oxide, thereby increasing the hydrogen stability of the source-channel interface 40.

Figure 3:
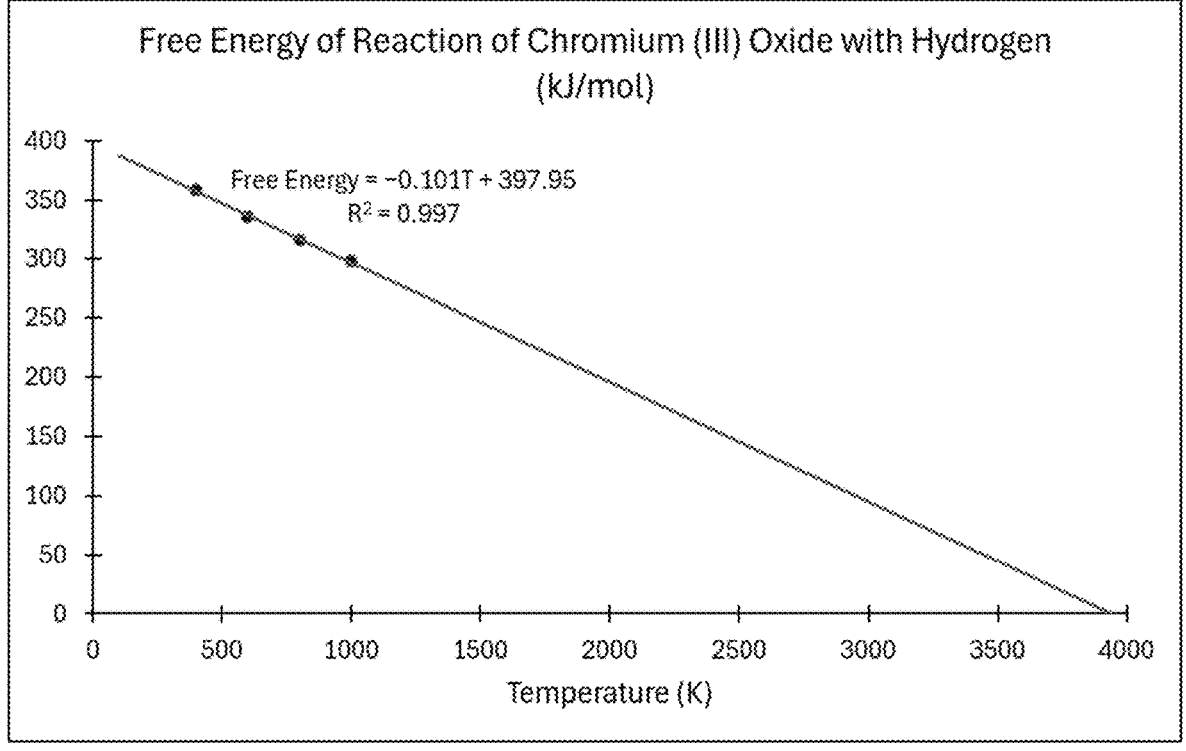
FIG. 3 is a plot of free energy of a reaction of chromium (III) oxide with hydrogen.

Regarding the reaction of chromium (III) oxide with hydrogen, namely:

$$Cr_2O_3(s) + 3H_2(g) \rightarrow 2Cr(s) + 3H_2O(g)$$

the free energy is positive for all temperatures below about 3900 K, as shown in FIG. 3. Thus, the chromium-oxygen bond is stable in the presence of hydrogen up to this temperature, which is considerably higher than the typical temperatures encountered in manufacturing and operation of TFTs. As such, the addition of chromium to a mainly ruthenium source 12 retains most or all of the benefits of ruthenium as the source 12 with the added advantage of improved stability of the oxidized source-channel interface 40.

The above also applies to the drain-channel interface 42, if used, depending on the material used to form the body of drain material 32.

Figure 4:
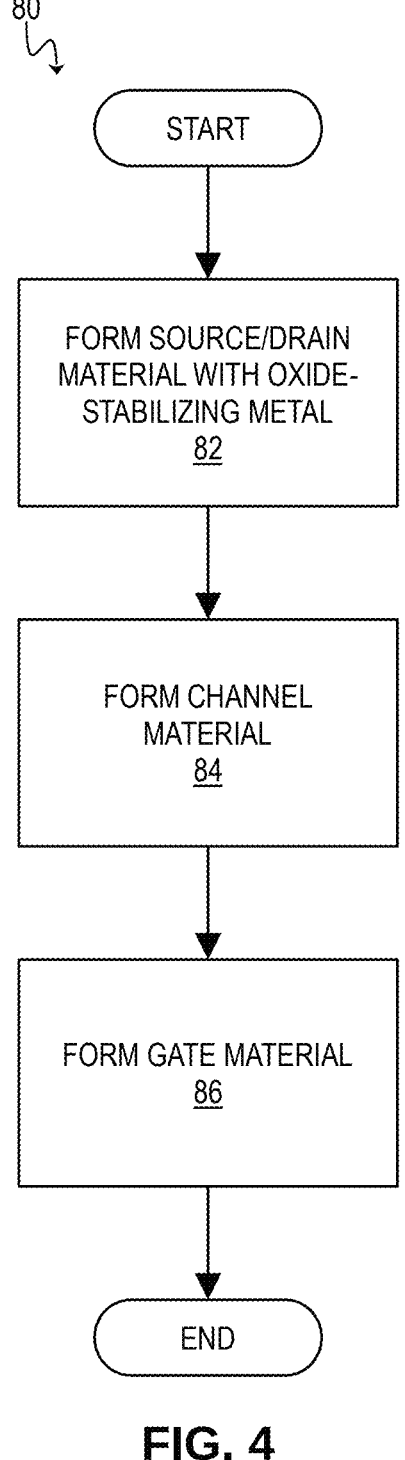
FIG. 4 is a flowchart of an example method of making a thin-film transistor that includes a source/drain channel interface having a combination of metal oxides.
Figure 5A:
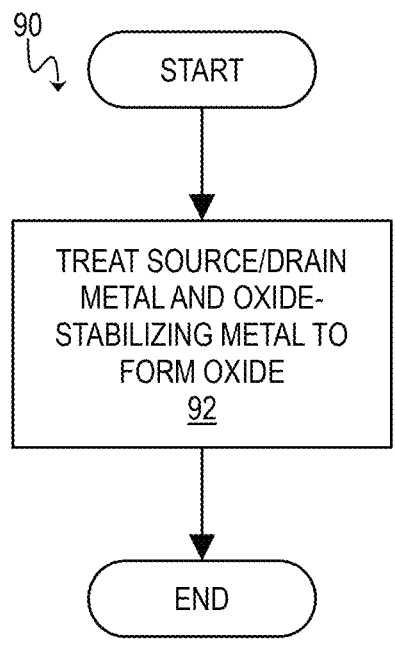
FIG. 5A is a flowchart of an example method of treating previously formed source/drain material to form a channel interface
Figure 5B:
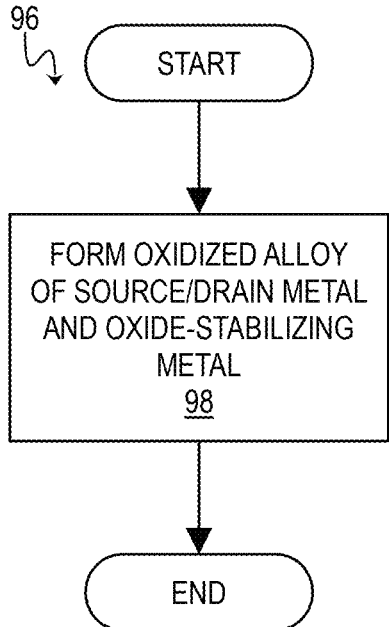
FIG. 5B is a flowchart of an example method of forming a channel interface with source/drain material simultaneously.

FIG. 4 shows an example method 80 of making a TFT, such as the TFT 10 discussed above. FIG. 5A shows a related example method 90 of treating previously formed source/drain material to form a channel interface, such as the interfaces 40, 42 discussed above. FIG. 5B shows a related example method 96 of forming a channel interface with source/drain material simultaneously.

TFT 10 may be manufactured using FEOL processes, MOL processes, BEOL processes, or a combination of such.

A manufacturing process may include forming a layer of TFTs 10 over another layer of TFTs 10 or over other devices, such as CMOS devices.

The manufacture of materials, layers, and/or features of semiconductor devices is referred to herein as "forming." As will be apparent to those of ordinary skill in the art, unless otherwise mentioned, "forming" is intended to include all semiconductor manufacturing techniques suitable and applicable therefor including, without limitation, deposition (e.g., chemical vapor deposition or CVD, atomic layer deposition or ALD, physical vapor deposition or PVD, etc.), plasma-enhanced/assisted atomic layer deposition (PEALD/PAALD), thermal ALD (T-ALD), plasma-enhanced chemical vapor deposition (PECVD), sputtering, lithography/photolithography, etching, implantation, annealing, oxidation, and similar processes. While examples of specific types of forming are given below, it should be understood that comparable methods of forming may be alternatively or additionally used, unless otherwise mentioned, without departing from the present disclosure.

During manufacture, the TFT 10 in its partially or fully complete state may be subject to an anneal, such as a forming gas (i.e., nitrogen and hydrogen) anneal, as may be required for various reasons, such as to stabilize material or to support the forming of material of the TFT 10 or other materials, components, or devices that are formed before or after the TFT 10 is formed. For example, the forming of interlayer dielectric (ILD) may involve forming gas anneal, the use of silane (SiH$_4$) may introduce hydrogen, etc.

Any suitable number and configuration of forming gas anneals may be performed. Annealing may be done at about 400° C. for about 120 minutes, for example, or longer (e.g., 3 or 4 hours). Higher temperatures and longer times are possible.

With reference to method 80, a substrate 20 may be formed as discussed above. An adhesion layer 22 of, for example, titanium nitride may be formed over the substrate by PEALD, for example.

Figure 6A:
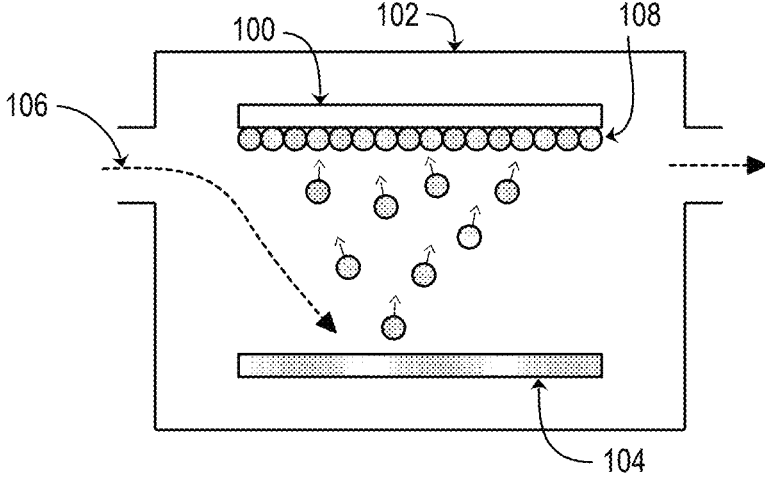
FIG. 6A is a diagram of an example sputtering process of forming a source/drain layer of ruthenium in combination with an oxide-stabilizing metal.
Figure 6B:
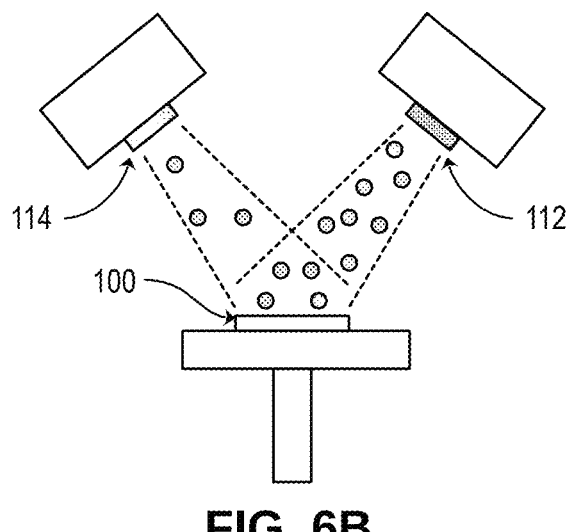
FIG. 6B is a diagram of an example co-sputtering process of forming a source/drain layer of ruthenium in combination with an oxide-stabilizing metal.

At block 82, layer of source/drain material with an oxide-stabilizing metal, i.e., ruthenium with chromium, is formed over the adhesion layer 22. The source/drain material may be formed by sputtering to a desired thickness. A Ru—Cr alloy sputter target may be used. The resulting source/drain material is majority ruthenium with minority of chromium, with proportions as discussed above. An example of such sputtering is shown in FIG. 6A, in which a substrate 100 (e.g., substrate 20 with adhesion layer 22) is placed in a chamber 102 with a Ru—Cr alloy sputter target 104, sputter gas 106 is introduced to the chamber 102, sputtering is performed, and a thin film 108 of ruthenium-chromium alloy is grown on the substrate 100. Alternatively, as shown in FIG. 6B, co-sputtering may be used, in which a ruthenium target 112 and a separate chromium target 114 are controlled to co-sputter respective proportions of ruthenium and chromium onto a substrate 100. The operational parameters of the co-sputtering machine may be adjusted to arrive at the desired alloy composition.

Figure 7:
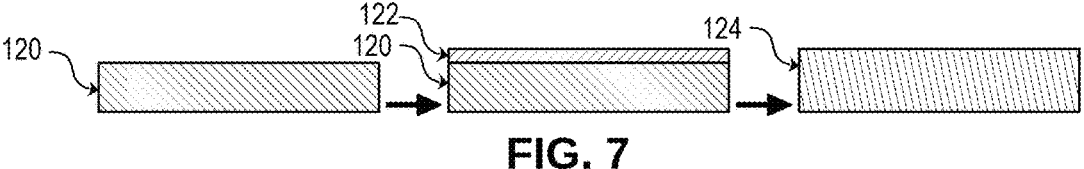
FIG. 7 is a cross-sectional view of another example process of forming a source/drain layer of ruthenium in combination with an oxide-stabilizing metal.

Alternatively, as shown in FIG. 7, an initial layer of ruthenium 120 may first be formed, and a subsequent layer of chromium 122 may be formed over the initial layer of ruthenium 120. The combined layers may then be annealed and, due to the good solubility of chromium in ruthenium, chromium atoms will diffuse into the bulk ruthenium to form the alloy 124. Alternately, annealing may be omitted if the subsequent treatment is able to penetrate the layer of chromium 122 to affect the initial layer of ruthenium 120 in addition to affecting the surface layer of chromium 122.

Subsequent treatment of source/drain material forms source and drain channel interfaces 40, 42 containing both ruthenium oxide and chromium oxide. Depending on the rate of diffusion and other factors, a gradient of chromium may exist. If a gradient is not desired, annealing may be performed to homogenize the alloy.

After it is deposited or otherwise formed, the layer of source/drain material is then patterned to form separate bodies of source and drain material 30, 32 and define a gap therebetween. Lithography and etching, such as inductively coupled plasma reactive ion etching (ICP-RIE), may be used to form the bodies of source and drain material 30, 32. The adhesion layer 22, if used, should also be etched to avoid shorting the source 12 and drain 14.

The source and drain channel interfaces 40, 42 may be formed in various ways, such as by using the method 90 of FIG. 5A or the method 96 of FIG. 5B.

Figure 8:
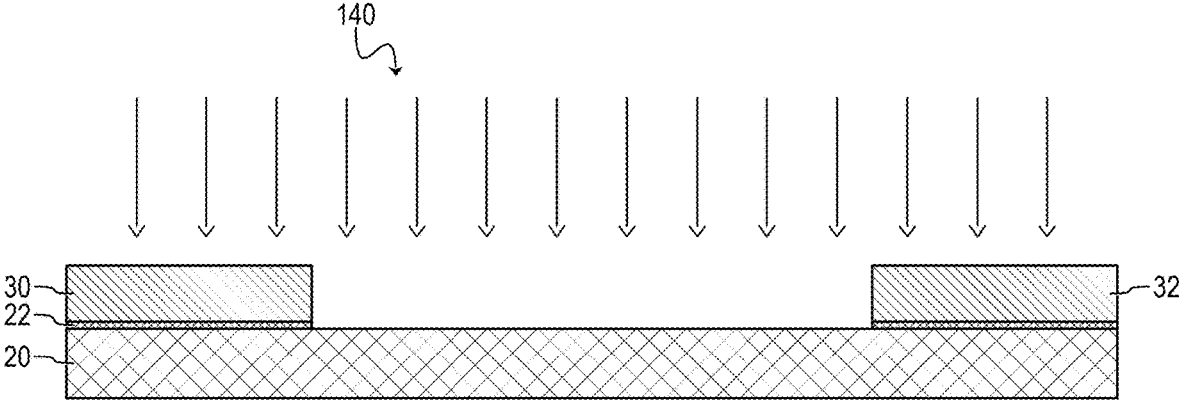
FIG. 8 is a cross-sectional view of an example process of treating a source/drain of ruthenium with an oxide-stabilizing metal to obtain a source/drain channel interface having a combination of metal oxides.

With reference to method 90 of FIG. 5A, the source and drain channel interfaces 40, 42 may be formed by treating the bodies of source and drain material 30, 32 with oxygen plasma 140, or similar treatment, to form a layer of oxidized material, at block 92 and also as shown in FIG. 8. In this case, block 92 follows block 82 of method 80.

As part of treatment, native oxide may be removed from the bodies of source and drain material 30, 32 by applying hydrogen plasma at, for example, about 600 W for about 30 seconds. Hydrogen may be provided in a carrier gas, such as argon.

In one example, the treatment is as follows: argon (~95%) and hydrogen (~5%) plasma for a duration of about 10 seconds; then oxygen plasma for a duration of about 60 seconds; and then nitrogen plasma for a duration of about 30 seconds. The treatment may be performed at 190° C. and 600 W plasma power. Remote plasma processing may be used with a carrier gas, such as argon. This sequence may be repeated two or more times.

Another example treatment is as follows: nitrogen/hydrogen plasma for a duration of about 30 seconds; then oxygen plasma for a duration of about 60 seconds; and then nitrogen plasma for a duration of about 180 seconds. The treatment may be performed at 190° C. and 600 W plasma power. This sequence may be repeated two or more times.

Another example treatment is oxygen plasma at about 190° C. and 600 W for a duration of about 60 seconds, which may be effected by two separate durations of 30 seconds with an intervening delay, such as about 60 to 90 seconds (e.g., 75 seconds). This sequence was used to obtain the test results shown in FIG. 9. In addition, this sequence may be repeated two or more times.

After treatment, as discussed above, the resulting source and drain channel interfaces 40, 42 include a combination of ruthenium oxide and chromium oxide.

With reference to method 96 of FIG. 5B, the source and drain channel interfaces 40, 42 may alternatively be formed simultaneously with the forming of at least part of the bodies of source and drain material 30, 32. Block 98 may replace or supplement block 82 of method 80. Forming the interfaces 40, 42 in this way may be achieved by sputtering, similar to as discussed above with respect to FIGS. 6A and 6B, with oxygen gas in the sputtering environment. Oxidized ruthenium-chromium alloy has been made with Ru:Cr ratios of 0.9:0.1, 0.8:0.2, and 0.7:0.3 by co-sputtering with oxygen gas delivered with argon carrier gas. For example, Ru:Cr was co-sputtered with a ratio of 0.9:0.1 with oxygen gas delivered at 3 standard cubic centimeters per minute (sccm) in 20 sccm of argon gas to form oxidized ruthenium-chromium. Since the channel interface is relatively thin, sputtering may be used to form a thin film of oxidized ruthenium-chromium on a body of bulk ruthenium.

Subsequent to forming the channel interfaces 40, 42, at block 84 of FIG. 4, a layer of channel material 50 is formed over the bodies of source and drain material 30, 32 and over the substrate 20 within the gap between the bodies of source and drain material 30, 32.

The layer of channel material 50, e.g., tin oxide, may be formed by PEALD with oxygen plasma, T-ALD, or similar technique. In various examples, chlorine, fluorine, nitrogen, or other chemical species may be introduced during the deposition process, so that the layer of channel material 50 includes such species.

When tin oxide is used as the layer of channel material 50, annealing may be useful to develop and/or maintain the preferred crystallite orientation discussed above. Annealing may be performed immediately after deposition of the layer of channel material 50 or at a later stage. Example anneal conditions are 400° C. for 120 minutes.

Gate dielectric material is then formed over the tin oxide channel material, at block 86 of FIG. 4. This may be done in two separate deposition and patterning operations. After an initial deposition of gate dielectric material, the gate dielectric material and underlying channel material may be patterned together using the same mask. Then, to prevent the channel material from shorting to the body of gate material 54, a second layer of gate dielectric material may be deposited and patterned in a manner that encapsulates the channel material, as shown at 66 in FIG. 1. Alternatively, a single deposition and patterning operation may be used to form the gate dielectric material.

The initial layer of gate dielectric material is formed over the layer of channel material. A layer of hafnium oxide may be formed by PEALD with oxygen plasma, T-ALD, or similar technique. The initial layer of hafnium oxide may be deposited to a desired thickness, such as about 5 nm.

The layers of tin oxide and hafnium oxide are then patterned. Lithography and etching, such as ICP-RIE, may be used. The same mask may be used to give the same pattern to both layers. This patterning completes the body of channel material 50.

The second layer of gate dielectric material is then formed over the patterned initial layer of gate dielectric material. PEALD, T-ALD, etc. may be used, as discussed above. The second layer of hafnium oxide may be deposited to a desired thickness, such as about 7.5 nm.

The second layer of gate dielectric material is then patterned. Lithography and etching, such as ICP-RIE, may be used. The pattern used to form the second layer of gate dielectric material should be larger than the pattern used to form the initial layer of gate dielectric material and channel material, so that edges of the body of channel material 50 are covered by gate dielectric material, as shown at 66 in FIG. 1. This patterning completes the body of gate dielectric material 52.

Then, a layer of gate material is formed. In this example, the layer of gate material ultimately forms the body of gate material 54 and the source and drain electrodes 60, 62. The layer of gate material may be formed by sputtering material mentioned above.

The layer of gate material may then be patterned to form the separate body of gate material 54 and source and drain electrodes 60, 62. Lithography and etching, such as ICP-RIE, may be used.

Thus, a transistor 10 of the structure shown in FIG. 1 is formed.

Further forming may be performed, such as annealing, as may be required for the particular application of the TFT 10.

Figure 9:
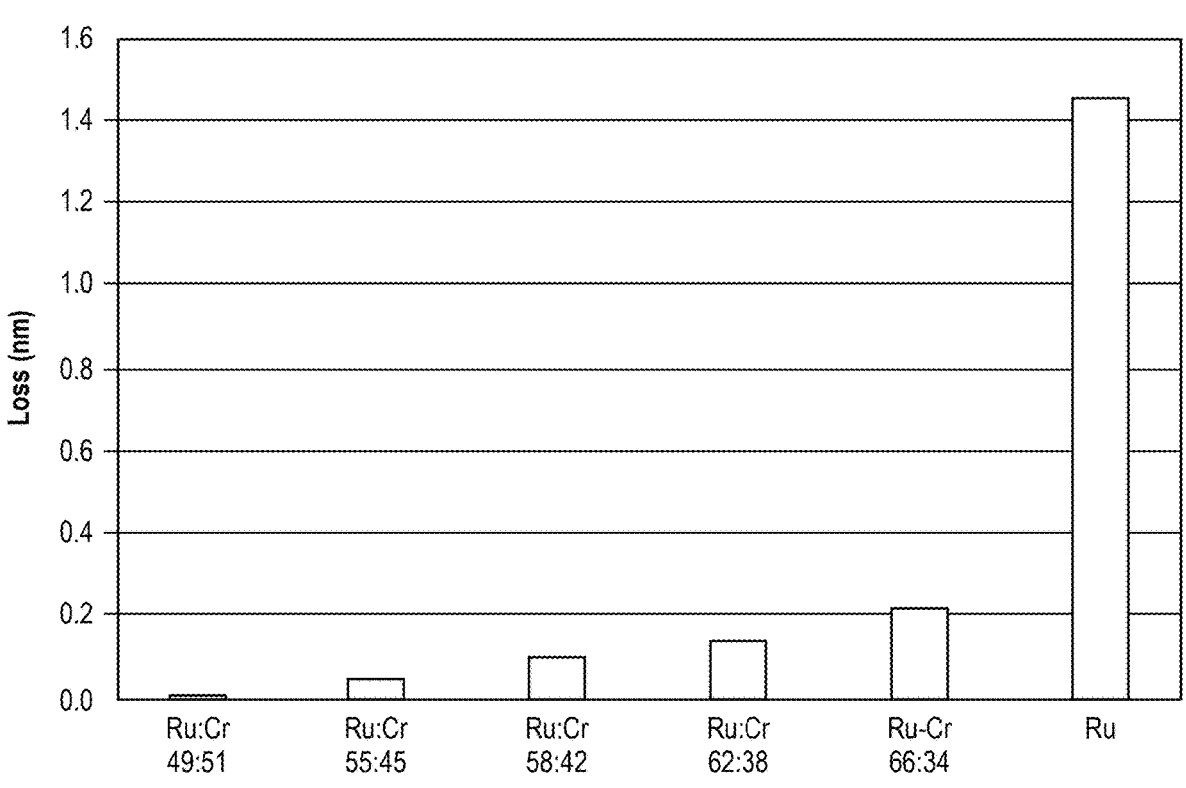
FIG. 9 is a chart oxide thickness loss for various alloy compositions under hydrogen plasma.

With reference to FIG. 9, tests were conducted on samples of sputtered ruthenium-chromium alloy with Ru:Cr ratios of 49:51, 55:45, 58:42, 62:38, and 66:34. Hydrogen, when provided as mentioned below, was provided at a rate of 5 sccm with argon carrier gas at a rate of 160 sccm. Native oxide on the alloy was removed by a first instance of hydrogen plasma at 600 W and then the source-channel interface treatment process, indicated above, was performed on the alloy. Ruthenium/chromium oxide was formed to a thickness of the order of 1 nm. Then, to simulate exposure to forming gas and/or hydrogen during subsequent processing, hydrogen plasma at about 30 W was applied for about 120 seconds. The amount of oxide thickness lost is shown in the plot for the various alloy ratios as well as for pure ruthenium. As can be seen, the pure ruthenium structure created an oxide that had the greatest loss (~1.4 nm), whereas the ruthenium-chromium alloy samples created oxides that exhibited much higher stability. An increasing amount of chromium led to increased hydrogen stability (reduced oxide loss). This trend is expected to hold for other concentrations of chromium, such as 5, 10, or 15 atomic %, which are in many cases contemplated to provide the benefit of chromium or other oxide-stabilizing metal without unduly reducing the concentration, and thus benefit, of ruthenium.

Figure 10A:
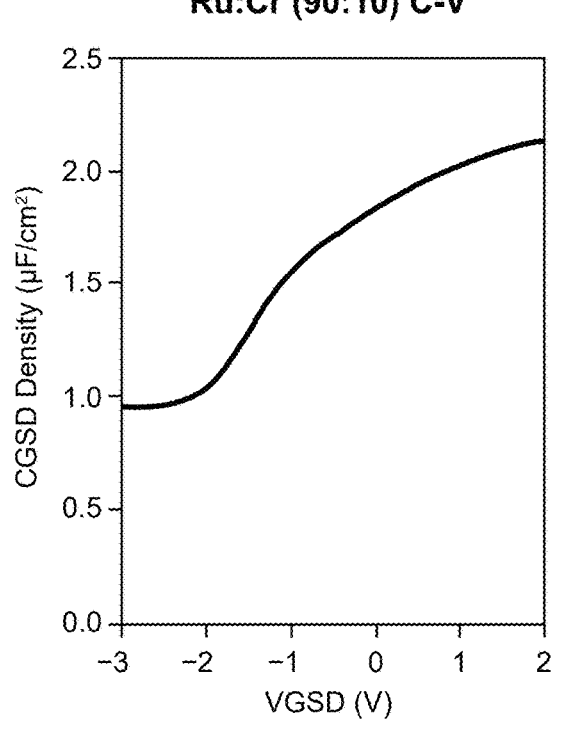
FIG. 10A is a plot of a capacitance-voltage (C-V) profile for an example thin film of ruthenium-chromium.
Figure 10B:
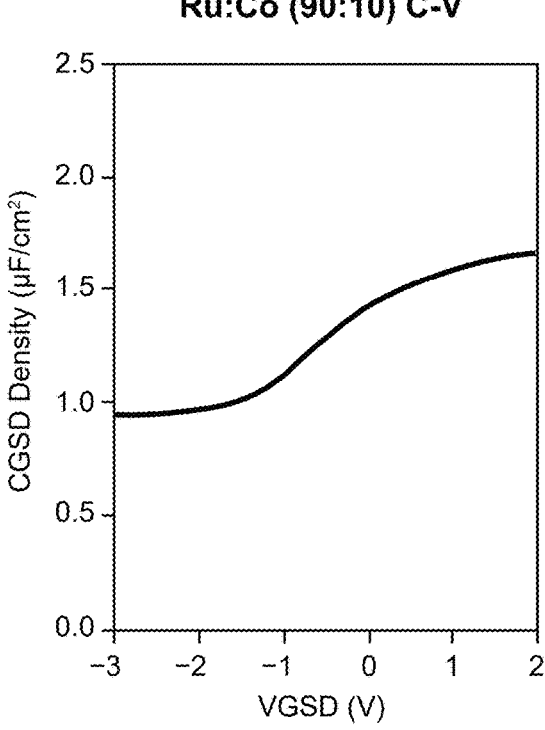
FIG. 10B is a plot of a C-V profile for an example thin film of ruthenium-cobalt

With reference to FIGS. 10A and 10B, metal-oxide semiconductor (MOS) capacitor (MOSCAP) capacitance-voltage (C-V) profiling was performed to determine the suitability of a source/drain of ruthenium with an oxide-stabilizing metal. FIG. 10A shows a C-V plot for a vertical MOSCAP including a thin film of ruthenium with chromium with a nominal Ru:Cr ratio of 90:10, that is, 9 parts ruthenium with 1 part chromium, as established by the relative deposition power levels used. FIG. 10B shows a C-V plot for vertical MOSCAP including a thin film of ruthenium with cobalt with a nominal Ru:Co ratio of 90:10.

The vertical MOSCAPs were formed as follows. Ruthenium and the oxide-stabilizing metal (chromium or cobalt, as the case may be) were co-sputtered onto a silicon substrate to a thickness of about 25 nm. The layer of ruthenium and the oxide-stabilizing metal was then treated to form an oxide layer as follows: argon (~95%) and hydrogen (~5%) plasma for a duration of about 10 seconds; then oxygen plasma for a duration of about 60 seconds; and then nitrogen plasma for a duration of about 30 seconds. The treatment was performed at 190° C. with 600 W plasma power.

Then, a layer of tin oxide ($SnO_2$) was formed by ALD over the treated layer of ruthenium and oxide-stabilizing metal to a thickness of about 7 nm.

Then, a layer of hafnium oxide ($HfO_2$) was formed by ALD over the layer of tin oxide to a thickness of about 7 nm.

Subsequently, the layered stack formed up to this point was patterned with photoresist for subsequent lift off.

Finally, layers of titanium (1 nm), titanium nitride (5 nm), and tungsten (30 nm) were formed over the hafnium oxide, in turn, by sputtering.

As can be seen in FIGS. 10A and 10B, ruthenium co-sputtered with chromium and cobalt, respectively, forms a thin film that is functional as a source/drain. The resulting thin film depletes the channel quite effectively. In addition, both C-V plots show about the same minimum capacitance which may indicate that the channel material (tin oxide) in both examples is depleting to about the same degree.

In view of the above, it should be apparent that a metal-oxide source/drain channel interface, which is positioned between source/drain material and a semiconductor channel material, may be made with a combination (e.g., alloy) of metals that are oxidized, so as to preserve electrical functionality, such as low off current, while improving stability, particularly in the presence of hydrogen during manufacture of TFTs.

Auxiliary verbs "can" and "may" are used interchangeably herein to denote components, features, and/or aspects of the present invention that are capable, configurable, selectable, modifiable, or optional, as would be apparent to one of ordinary skill in the art given the benefit of this disclosure. These terms should not be taken as limiting the present invention, unless otherwise specified.

Spatial prepositions, such as "over", "under", "above", "below", "up", "down", "beside", etc., are provided for sake of explanation and should not be taken as limiting the present invention to an absolute spatial orientation or arrangement, unless otherwise specified. For example, one of ordinary skill in the art would understand that a first element is above or below a second element depending on the perspective of the observer.

The articles "a", "an", "the", "said", etc. indicate singular and plural, unless otherwise specified.

The conjunction "or" is used inclusively and should be understood to mean "and/or", unless otherwise specified.

Sets of elements A, B, C described as A, B, or C; A, B, and C; A, B, and/or C; or A, B, C should be considered open sets from which one or more elements or a combination of one or more elements may be selected, unless otherwise specified. Sets of elements are open, unless specified to be closed, for example, by use of the term "consist", "consisting", or similar closed language.

The above clarifications apply to both the specification and claims.

The figures are not to scale, unless otherwise specified.

The above-described embodiments of the invention are intended to be examples of the present invention and alterations and modifications may be effected thereto, by those of ordinary skill in the art, without departing from the scope of the invention which is defined solely by the claims appended hereto.

The invention claimed is:

1. A thin-film transistor comprising:
a source;
a drain;
a gate; and
a body of channel material disposed within the influence of the gate between the source and the drain, the body of channel material including a metal oxide, the body of channel material to form a carrier channel between the source and the drain when sufficient voltage is applied to the gate;
wherein the source includes a body of source material that includes ruthenium and an oxide-stabilizing metal that has an oxide that has greater hydrogen stability than ruthenium oxide, and
wherein the body of source material contains a majority of ruthenium with a minority of the oxide-stabilizing metal.

2. The thin-film transistor of claim 1, wherein the oxide-stabilizing metal is selected from the group consisting of chromium, cobalt, and molybdenum.

3. The thin-film transistor of claim 1, wherein the oxide-stabilizing metal is chromium.

4. The thin-film transistor of claim 1, further comprising a source-channel interface at the body of source material adjacent the body of channel material, wherein the source-channel interface includes ruthenium oxide and the oxide of the oxide-stabilizing metal.

5. The thin-film transistor of claim 1, wherein the body of source material consists essentially of ruthenium and the oxide-stabilizing metal.

6. The thin-film transistor of claim 1, wherein the body of source material is ruthenium with about 15 atomic % oxide-stabilizing metal or less.

7. The thin-film transistor of claim 1, wherein the body of source material is ruthenium with about 10 atomic % oxide-stabilizing metal or less.

8. The thin-film transistor of claim 1, wherein the body of source material is ruthenium with about 5 atomic % oxide-stabilizing metal or less.

9. The thin-film transistor of claim 1, wherein the drain includes a body of drain material that includes ruthenium and the oxide-stabilizing metal.

10. The thin-film transistor of claim 9, further comprising a drain-channel interface at the body of drain material adjacent the body of channel material, wherein the drain-channel interface includes ruthenium oxide and the oxide of the oxide-stabilizing metal.

11. A method of manufacturing a thin-film transistor comprising:
forming a body of source material;
forming a body of drain material;
forming a body of channel material; and
forming a body of gate material;
wherein the body of channel material is formed within the influence of the body of gate material between the bodies of source and drain material, wherein the body of channel material includes a metal oxide;
wherein the body of source material includes ruthenium and an oxide-stabilizing metal that has an oxide that has greater hydrogen stability than ruthenium oxide, and
wherein the body of source material is formed to contain a majority of ruthenium with a minority of the oxide-stabilizing metal.

12. The method of claim 11, wherein the oxide-stabilizing metal is selected from the group consisting of chromium, cobalt, and molybdenum.

13. The method of claim 11, wherein the oxide-stabilizing metal is chromium.

14. The method of claim 11, further comprising forming a source-channel interface at the body of source material, wherein the source-channel interface includes ruthenium oxide and the oxide of the oxide-stabilizing metal.

15. The method of claim 14, wherein forming the source-channel interface comprises applying oxygen plasma to the body of source material.

16. The method of claim 11, wherein the body of source material is formed to consist essentially of ruthenium and the oxide-stabilizing metal.

17. The method of claim 11, wherein the body of source material is formed of ruthenium with about 15 atomic % oxide-stabilizing metal or less.

18. The method of claim 11, wherein the body of source material is formed of ruthenium with about 10 atomic % oxide-stabilizing metal or less.

19. The method of claim 11, wherein the body of source material is formed of ruthenium with about 5 atomic % oxide-stabilizing metal or less.

20. The method of claim 11, wherein the body of drain material includes ruthenium and the oxide-stabilizing metal.

21. The method of claim 20, further comprising forming a drain-channel interface at the body of drain material, wherein the drain-channel interface includes ruthenium oxide and the oxide of the oxide-stabilizing metal.

22. The method of claim 21, wherein forming the drain-channel interface comprises applying oxygen plasma to the body of drain material.

23. The method of claim 11, wherein the body of source material is formed by sputtering.

\* \* \* \* \*